United States Patent [19]
Aichelmann, Jr. et al.

[11] Patent Number: 5,434,868
[45] Date of Patent: Jul. 18, 1995

[54] FAULT TOLERANT MEMORY

[75] Inventors: Frederick J. Aichelmann, Jr., Hopewell Junction, N.Y.; Cecil A. Branson, Manassas, Va.

[73] Assignee: International Business Machines Corporation, Armonk, N.Y.

[21] Appl. No.: 113,005

[22] Filed: Aug. 30, 1993

Related U.S. Application Data

[63] Continuation of Ser. No. 455,120, Dec. 22, 1989, abandoned.

[51] Int. Cl.⁶ ............................................. G06F 11/20
[52] U.S. Cl. ...................................................... 371/10.1
[58] Field of Search .............................. 371/10.1, 10.2

[56] References Cited

U.S. PATENT DOCUMENTS

| | | | |
|---|---|---|---|
| 3,331,058 | 7/1967 | Perkins, Jr. ........................ | 340/172.5 |
| 3,436,734 | 4/1969 | Pomerene et al. ................ | 340/172.5 |
| 4,393,474 | 7/1983 | McElroy ............................. | 365/200 |
| 4,450,559 | 5/1984 | Bond et al. ........................ | 371/10 |
| 4,456,993 | 6/1984 | Taniguchi et al. ................ | 371/10.1 |
| 4,458,349 | 7/1984 | Aichelmann, Jr. et al. ........ | 371/13 |
| 4,479,214 | 10/1984 | Ryan .................................. | 371/11 |
| 4,483,001 | 11/1984 | Ryan .................................. | 371/11 |

(List continued on next page.)

FOREIGN PATENT DOCUMENTS 2823457  12/1982  Germany .
WO87/03716  6/1987  WIPO .

OTHER PUBLICATIONS

Rennels, D. et al., "RMS: A Reliability Modeling System for Self-Repairing Computers", *1973 International Conf. on Fault-Tolerant Computing*, pp. 131-135.

Losg, J., "Influence of Fault-Detection and Switching Mechanisms on the Reliability of Stand-By Systems", *1975 Int'l. Conf. on Fault-Tolerant Computing*, pp. 81-86.

Carter, W. et al., "Implementation of an Experimental Fault-Tolerant Memory System", *IEEE Trans. on Computers*, vol. C-25, No. 6, Jun. 1976, pp. 557-568.

Grosspietsch, K. et al., "A Dynamic Reconfiguration Scheme for Stand-By Memory Systems", *Digital Processes*, vol. 6, Autumn-Winter 1980, pp. 257-270.

Sarrazin, D. et al, "Fault-Tolerant Semiconductor Memories", *Computer*, Aug. 1984, pp. 49-56.

Rao, T. et al, *Error-Control Coding for Computer Systems*, © 1989, published by Prentice-Hall, Inc., pp. 65, 138-143.

Chen, C., "Error Correcting Codes for Semiconductor Memory Applications: A State of the Art Review", *IBM J. Res. Devel.*, vol. 28, No. 2, pp. 124-134.

Patterson, D. et al., "A Case for Redundant Arrays of Inexpensive Disks (RAID)", *Proc. ACM SIGMOD Conf.*, Jun. 1988, pp. 109-116.

IEEE Transactions On Computers, vol. C-20, No. 11, Nov. 1971 pp. 1306-1311 entitled "Reliability Modeling For Fault-Tolerant Computers".

(List continued on next page.)

Primary Examiner—Stephen M. Baker
Attorney, Agent, or Firm—Charles W. Peterson, Jr.

[57] ABSTRACT

A fault tolerant memory system including a plurality of memory chips arranged to produce an array of addressable locations. Each addressable location has a plurality of data bits and a plurality of check bits for checking the integrity of all the data bits and check bits at a given addressable location. A pool of spare chips including at least two spare chips are available for assignment to replace any of the memory chips or a previously assigned spare chip in the event that a chip failure is identified. A memory maintenance facility for detecting and assigning spares, in response to the data bits and the check bits read from a given location in memory, is provided for detecting a failing memory chip or previously assigned spare chip and for assigning a previously unassigned spare chip to replace the failing memory chip or previously assigned spare chip.

4 Claims, 8 Drawing Sheets

U.S. PATENT DOCUMENTS

| | | | |
|---|---|---|---|
| 4,485,471 | 11/1984 | Singh et al. | 371/2 |
| 4,488,298 | 12/1984 | Bond et al. | 371/11 |
| 4,584,681 | 4/1986 | Singh et al. | 371/10 |
| 4,584,682 | 4/1986 | Shah et al. | 371/10 |
| 4,653,050 | 4/1986 | Singh et al. | 371/10 |
| 4,993,030 | 2/1991 | Krakauer et al. | 371/40.1 |
| 5,148,432 | 9/1992 | Gordon et al. | 371/10.1 |

OTHER PUBLICATIONS

IBM J. Res. Develop. vol. 28, No. 2, Mar. 1984, pp. 184–195 by C. L. Chen and R. A. Rutledge entitled "Fault–Tolerant Memory Simulator".

IBM J. Res. Develop. vol. 28, No. 2, Mar. 1984, pp. 196–205 by M. R. Libson and H. E. Harvey entitled "A General–Purpose Memory Reliability Simulator".

IBM J. Res. Devel., vol. 28, No. 2, Mar. 1984, pp. 177–183, entitled "Fault–Tolerant Design Techniques For Semiconductor Memory Applications".

IBM J. Res. Devel., vol. 28, No. 2, Mar. 1984, pp. 124–134, entitled "Error–Correcting Codes For Semiconductor Memory Applications: A State–of–the–Art Review".

FAULT TOLERANT MEMORY

This application is a continuation of application Ser. No. 07/455,120, filed Dec. 22, 1989 now abandoned.

BRIEF DESCRIPTION

The present invention relates broadly to the field of digital computers and the like and particularly to the field of fault tolerant digital memories for use in digital computers and the like.

BACKGROUND OF THE INVENTION AND PRIOR ART

Digital computers have been utilized for many years for performing many useful tasks. All digital computers today have memories which are used to store both data and computer instructions. Such memories are virtually all solid state devices which have the advantage of being inexpensive to manufacture and yet provides high speed operation.

These memories are today comprised of a plurality of chips which each have typically 1 million or more addressable single bit positions. By configuring a plurality of such chips rows and columns so as to respond to an address, a data word can be stored or retrieved from the addressed location. In small computer systems, each addressable location comprises a byte or 8 data bits while in large computer systems, an addressable location typically comprises one, two or even four 32 bit words. In all such systems, each addressable location may also have parity bits for elementary checking of the memory.

With the very large number of memory chips that are required in large computer system memories, the probability increases that one or more memory chips may fail in use thereby making the memory output unreliable unless some measure of fault tolerance is built into the system. As a result, memories have been developed which are capable of operating with at least some defective storage locations. Examples of such memory systems are found in U.S. Pat. No. 3,331,058 and 3,436,734.

In some prior art memories, when a given location is determined to be defective, the defective location is bypassed. In other memories, an auxiliary memory is employed to store the data which is desired to be stored at a defective location. Suitable control circuitry is provided to make sure if a defective location is addressed, that the data is either read or stored into the auxiliary memory. An example of such a system is found in U.S. Pat. No. 4,450,559.

Another approach to solving the problem of defective memory location has been to utilize error detection and correction techniques. In using such an approach, the memory is designed so that each data word read from memory has both data bits and error detecting and correcting bits. The easiest an well known check is to do a parity check to isolate where in the data word an error has occurred. To correct the error once identified and located, further error correction bits are needed. In implementing such a system, it is well known that the number of checking and correcting bits required for each memory word becomes larger as the number of detectable and correctable errors per memory word goes up. As such, there is an increased hardware cost penalty whenever an error detection and correction system is to be implemented in a computer system.

In typical memory systems having error detection and correction capability, each data fetch results in receiving a plurality of data bits and some checking bits. For example, in some large contemporary computer memories such as in the IBM 3090, the system will fetch 2 data words of 64 bits each plus 16 error checking and correcting (ECC) bits on each memory fetch operation. The system is designed so that 8 ECC bits are used to detect and correct errors in one of the two data words and the remaining data word is checked and corrected by a second set of 8 ECC bits. Given the number of ECC bits used in this scheme, detection and correction of one bit errors in the 64 bit data words checked thereby is made possible. It also permits detection of 2 bit errors in 64 bit words although error correction is not possible.

To further enhance such memory systems, spare chips have been included for replacing chips which have been detected to have failed. When such a bit failure is identified in a given data word, a spare chip is assigned to replace the failing chip. For the exemplary memory system described above, spare chips are assigned to each row of chips that supply each pair of 64 bit data words. Hence, for a quad word fetch, two words of 64 data bits plus 16 ECC bits plus available spare bits are fetched.

BRIEF DESCRIPTION OF THE INVENTION

The present invention differs form the above described memory system in many significant ways. The present invention includes means to fetch and store two 64 bit data words, 9 ECC bits and at least two spare bits in a pool of spares. If greater reliability is desired or needed or if the memory size requires it, more spare bits can be made available in the spare pool. With only two spares per row of chips in the memory, however, this configuration will provide the same level of error detection and correction plus spare allocation as the above described memory system. The advantages of this configuration include the fact that spares in the pool can be assigned to replace any failing chip in the memory whether in the 137 bits of data and ECC bits or another spare chip. A second cost saving is realized by the present invention in that the system requires fewer ECC bits as error checking and correcting is done across the entire 128 bit data word as opposed to doing two error checking and correcting functions each across 64 data bits. A third advantage achieved by the present invention is shown by statistical analysis which proves the memory can utilize less reliable parts than is required by prior art systems while achieving the same degree of fault tolerance. A fourth advantage is that the present design will provide manufacturing yield enhancement in the various configurations of memory where the invention is utilized.

In addition to the above memory features, the present system includes a spare merging network for merging the data from an assigned spare chips into the bit position of a previously identified failing data chip. Thereafter, the read data is checked by an ECC facility which will detect double bit errors and correct single bit errors. When an error is detected, error syndrome information and address information is sent to a maintenance facility which counts errors. When a given chip has been determined thereby to have had a preset number of errors, the chip associated therewith needs to be replaced by a spare. The maintenance facility then assigns the next available spare to replace the failing chip. This sparing information is sent to the spare merging network so that subsequent memory fetches to the chip which has failed will have the assigned spare replacing the failing chip. When a store operation occurs, the spare merging network diverts data bits destined for failing chips in the memory to preassigned spare chips.

The above mentioned objects, advantages and features of the present invention are described in greater detail below in connection with the drawings which form a part of the disclosure and wherein.

Figure 1:
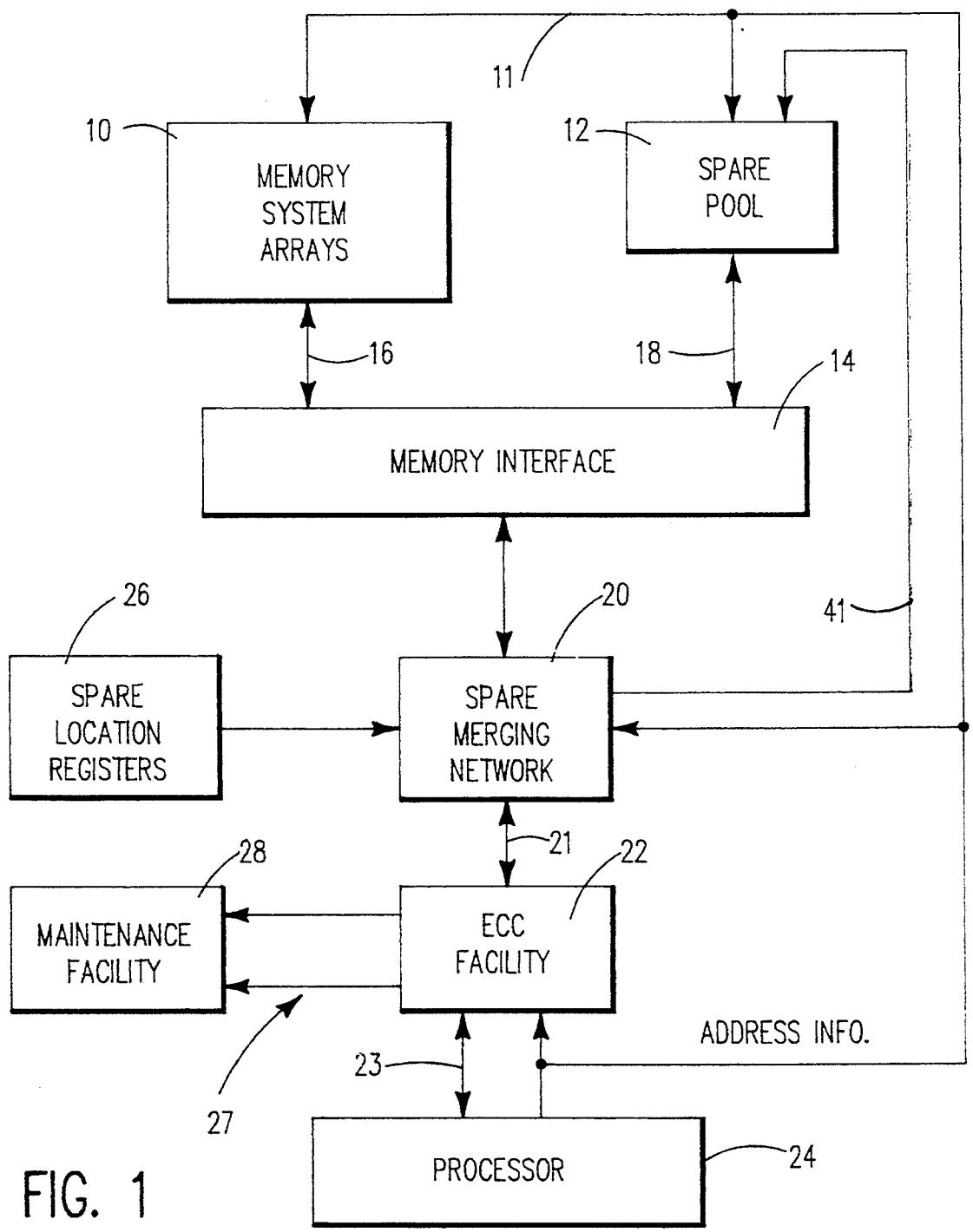
FIG. 1 is a block diagram of the fault tolerant memory system of the present invention.
Figure 2:
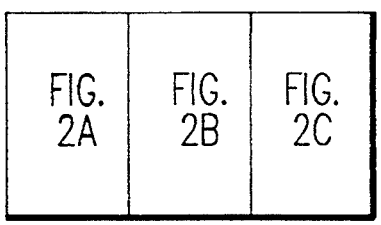
FIG. 2 illustrates how FIGS. 2A, 2B and 2C fit together.
Figure 2A:
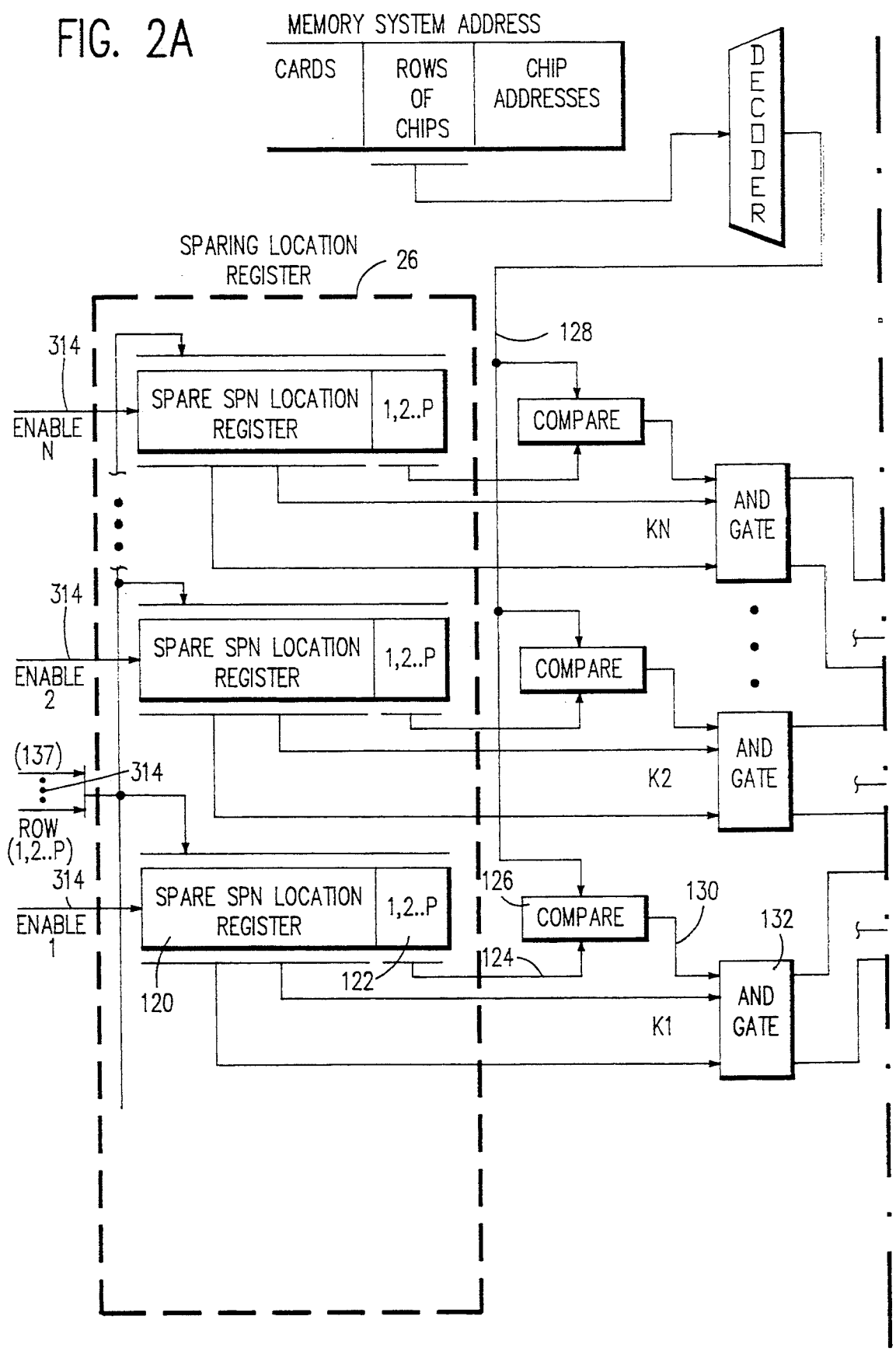
Figure 2B:
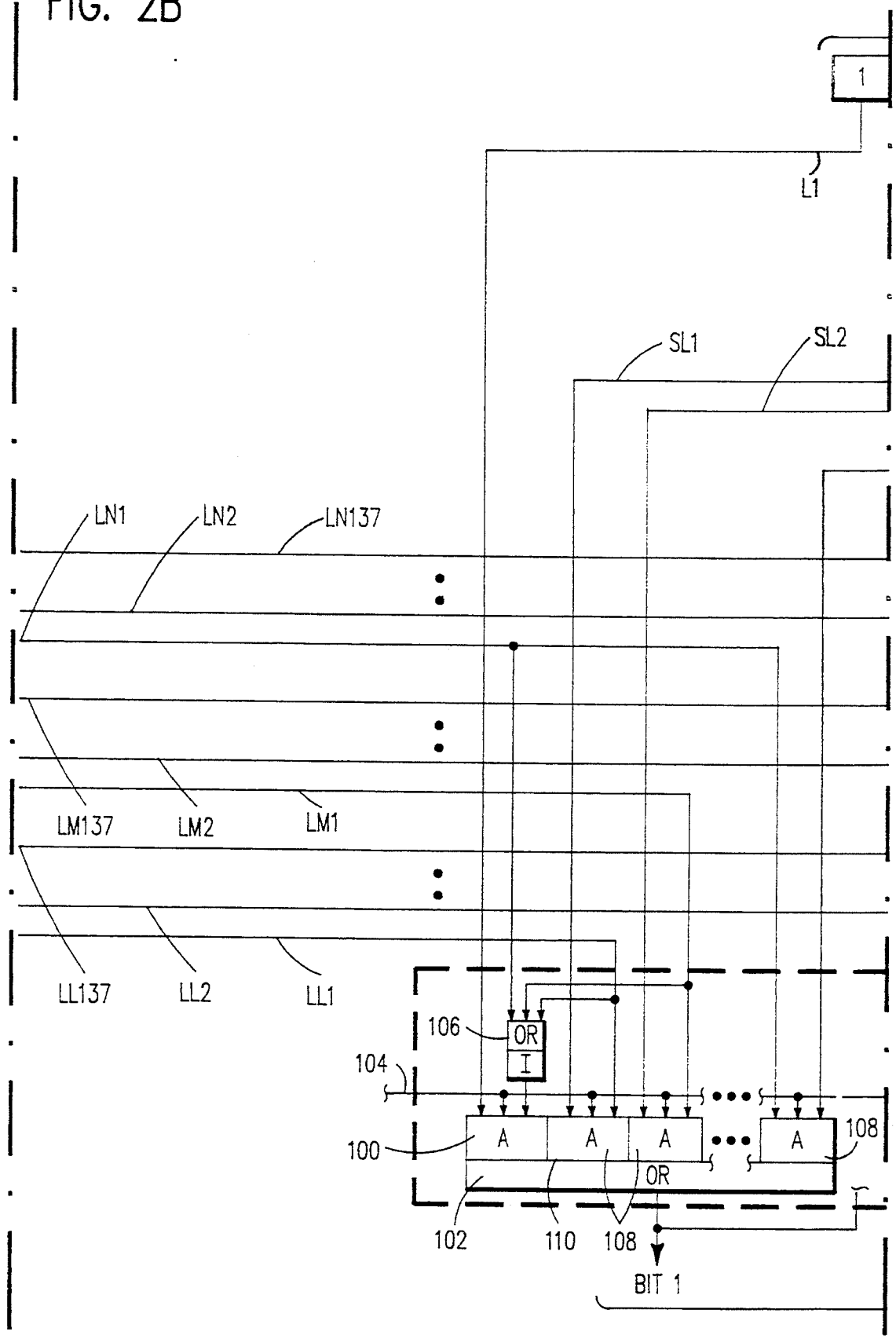
Figure 2C:
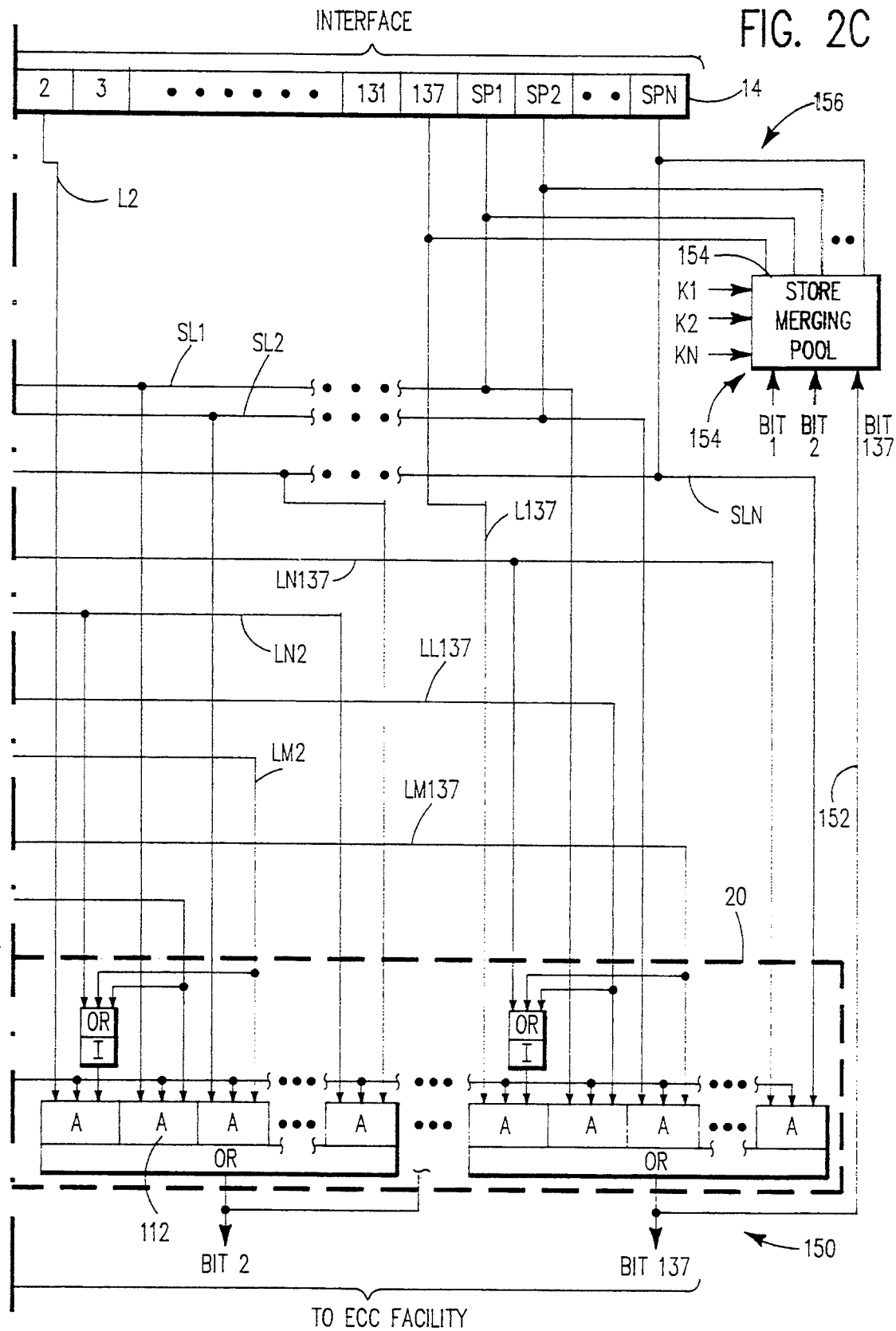
Figure 3:
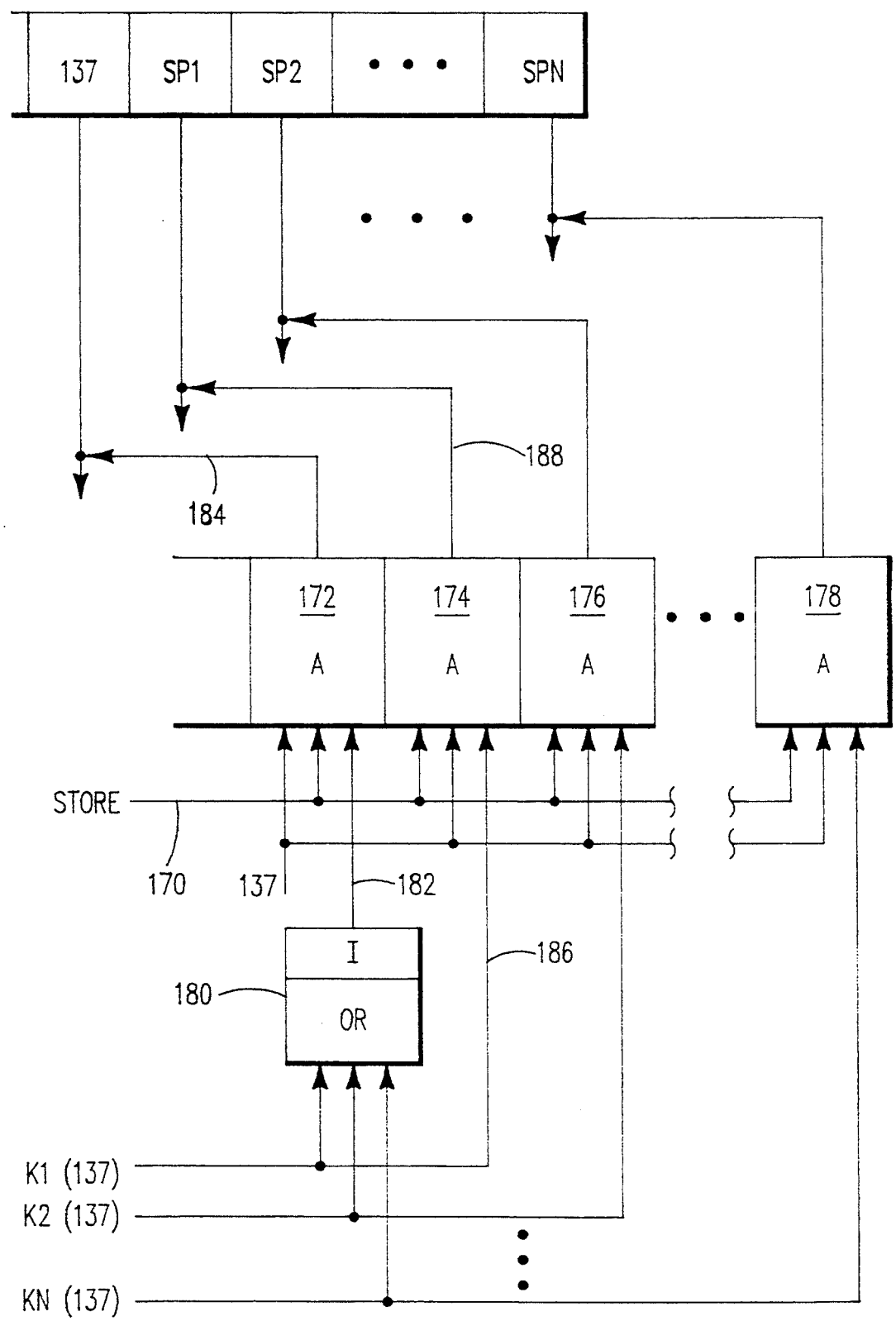
Figure 4:
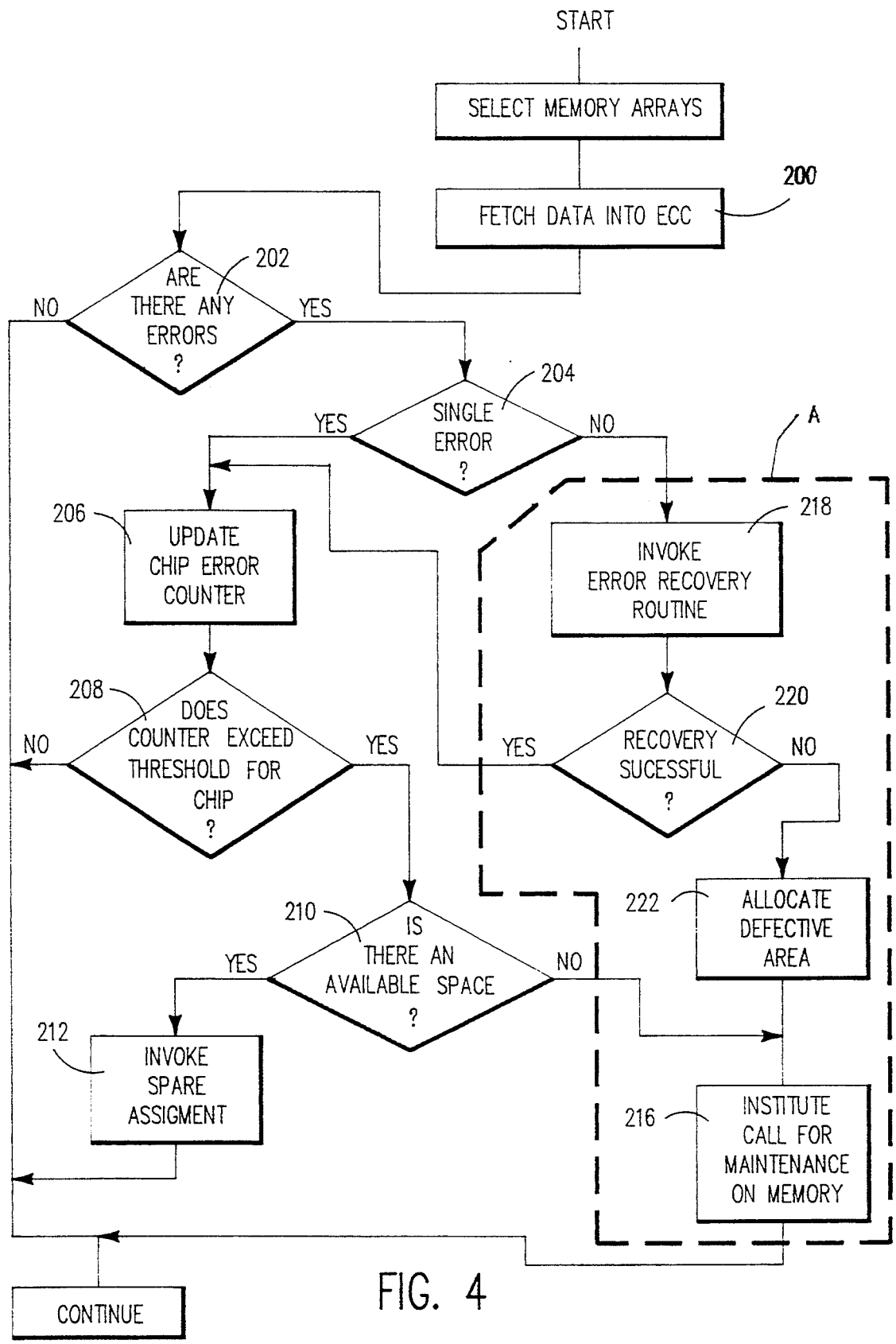
Figure 5:
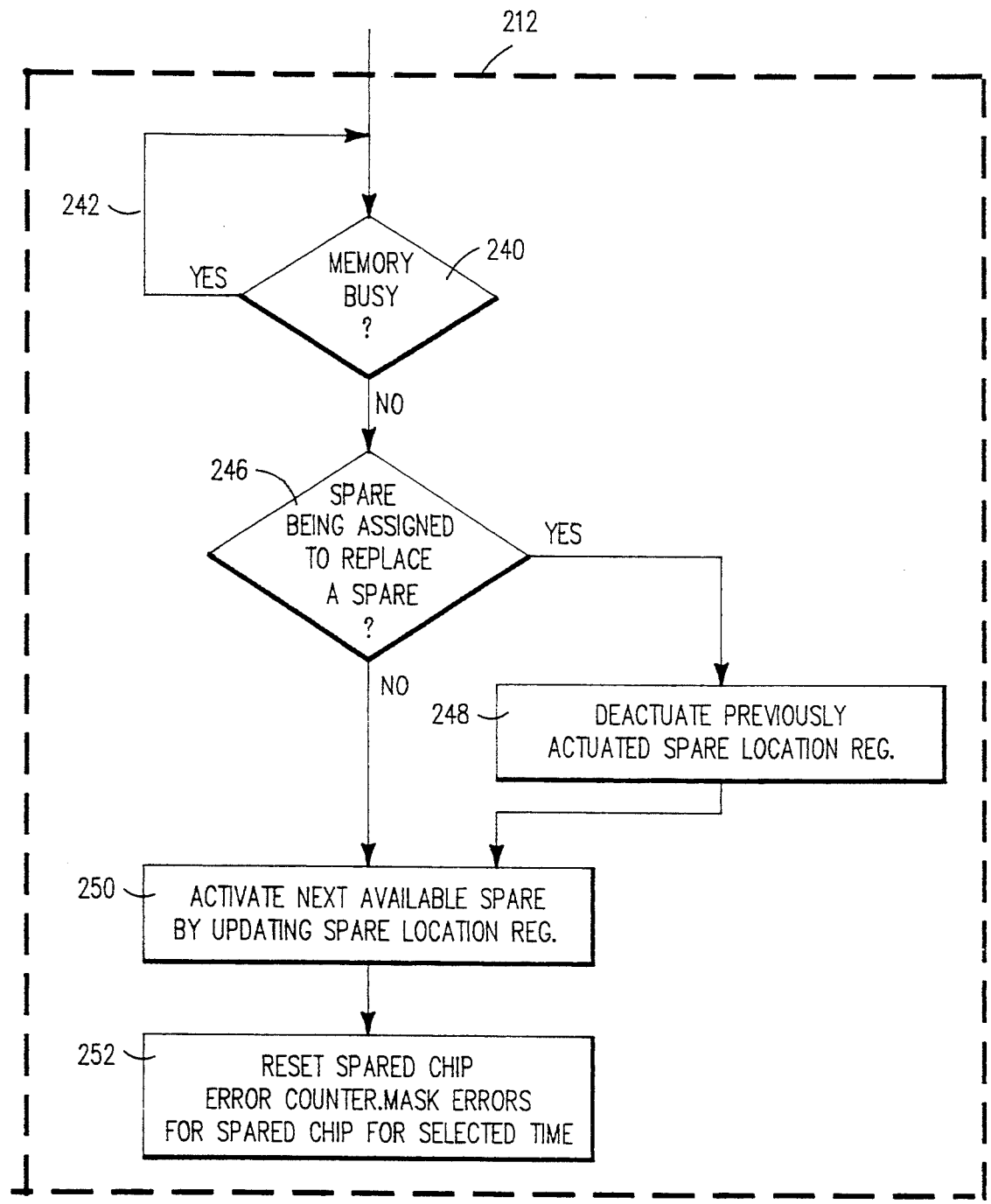
Figure 6:
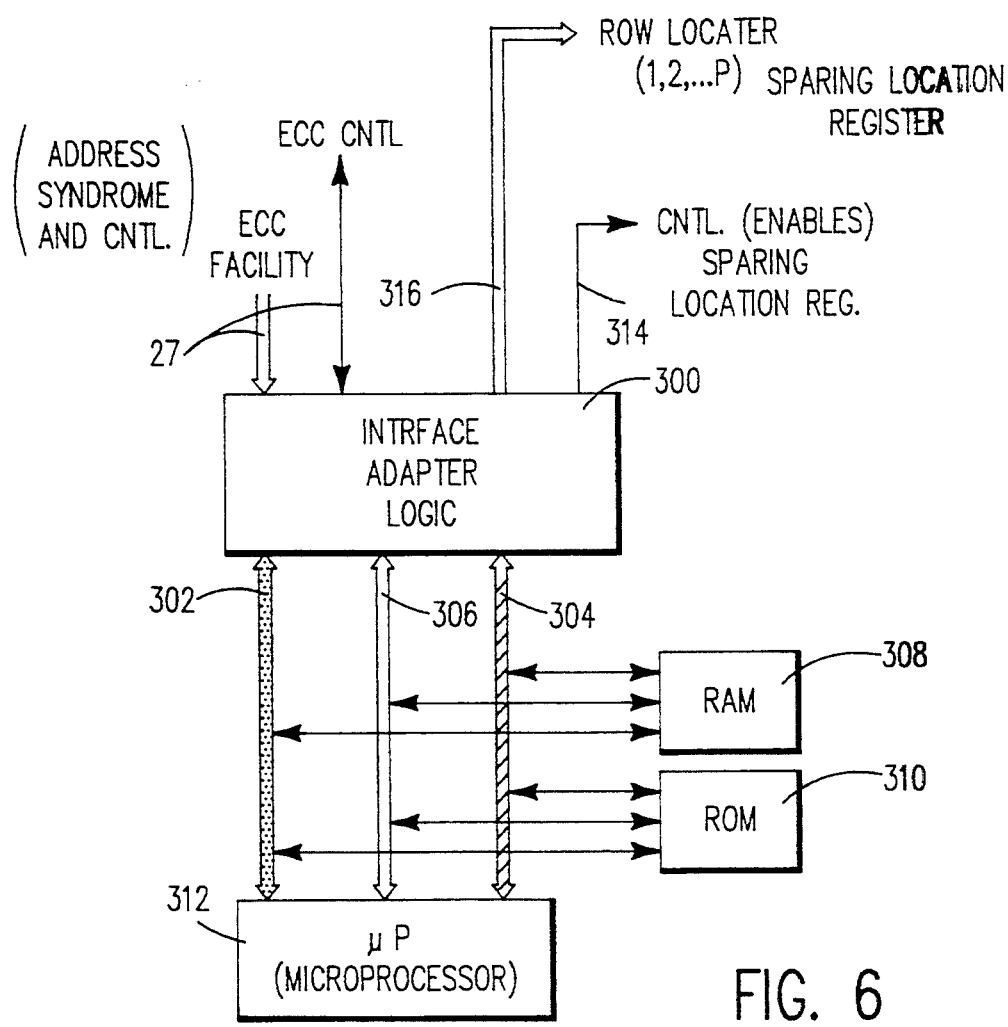
Figure 7:
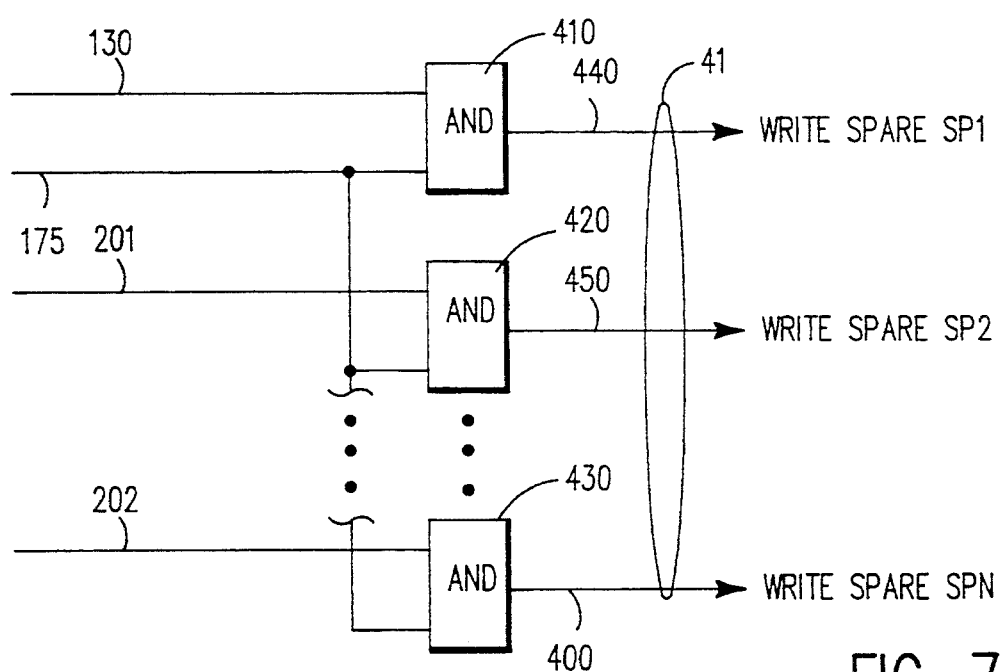

FIG. 2A, 2B and 2C comprise a block diagram of the sparing location registers and the spare merging network and associated logic and particularly the read merging elements;

FIG. 3 illustrates a store merging element which comprises part of the spare merging network and is used whenever data is stored to the memory array chips and to the spare chips;

FIG. 4 is a flow chart of the manner of operation of the components illustrated in FIG. 1;

FIG. 5 is a flow chart of the invoking of spare assignment step illustrated in FIG. 4;

FIG. 6 illustrates a typical memory maintenance facility used in the system illustrated in FIG. 1; and FIG. 7 illustrates control circuitry operational in data storing to assure only the correct spare circuits are updated.

DETAILED DESCRIPTION

The fault tolerant memory system of FIG. 1 includes a plurality of memory elements which are disposed in an array configuration 10. In a typical embodiment of the invention, the memory system array 10 comprises 137 DRAM chips in each of a plurality of rows of chips. In addition, a pool of spare memory units is provided containing at least 2 spare memory units each of which may be assigned to replace an identifiable portion of a memory element which is determined to have failed. These memory elements and memory units are configured so that each memory fetch will read a data word of 128 data bits plus 9 error checking and correcting bits plus all of the spare memory units in the pool of spares available for replacing failing portions of the memory elements or other spare memory units determined to have failed. The memory system is configured so that on storing operations, 128 data bits plus 9 error checking and correcting bits plus all the assigned spare memory units associated with the address being stored will receive data and control signals to allow the data to be correctly stored. It should be noted that while 128 data bits are fetched or stored, these bits preferably comprise two 64 bit data words.

The memory system of FIG. 1 is addressed by a memory address generated by the processor 24 which places the desired memory address on the address bus 11. The address on bus 11 can be broken into two fields, one field defining a row of memory elements (chips) to be accessed in the array and the other field defining the address within each memory element (chip) in the defined row of elements where the desired data is to be either stored or fetched. The full address on bus 11 is applied to the memory array 10 and the element address portion of the address on bus 11 is applied to all of the units in the pool of spare memory units 12 in a conventional manner so that the location specified by the address information on bus 11 is used to either read data from or store data into the location addressed by the data on bus 11. The address bus 11 also couples to the spare merging network 20 and the ECC facility 22 and is used thereby to assure that the proper spare units are selected during memory read or write operations to replace previously identified failing portions of memory elements or failing spare memory units.

The preferred error checking and correcting scheme used is known as single error correction-double error detection. (SEC-DED) wherein the number of error checking (check) bits is determined by the smallest digit r which satisfies the equation $k+r \leq 2^{(r-1)}$ where k is the number of data bits and r is the number of check bits. Other error checking and correcting schemes can be used with systems of the type described herein without departing from the spirit of the present invention. For example, a double error correction-triple error detection scheme could be used in place of the SEC-DED error detection and correction code used in the preferred embodiment of the invention. The remaining discussion, however, will address SEC-DED as such is the preferred embodiment of the present invention but those skilled in the art will recognize that the scope of the invention is not limited thereto.

The fault tolerant memory of FIG. 1 also includes some sparable memory units in a spare memory unit (chip) pool 12. In the preferred embodiment of the present invention, there are at least two sparable memory units which are functionally the same as the portion of the memory array 10 which can be identified as failing and for which a spare memory unit can be assigned. In the preferred embodiment, at least 2 spare chips, of the type used in the memory system array 10 in each row of chips, comprise the sparable memory units. Such memory units (chips) are typically 1×1 Meg DRAMs where the memory elements (chips) in the array 10 are the same. It is also possible to use 1×1 Meg DRAMs as sparable memory units in systems where the memory array 10 comprises a plurality of 4×1 Meg DRAMs as each of the 4 bits contained therein can be identified individually as having failed and can be replaced by a spare unit (chip) having 1×1 Meg capacity. Those of skill in the art will also realize that the capacity of each memory or spare chip can be greater or smaller than the 1 Megabit DRAM referred to herein as the present invention is not limited in any way to the particular size of the DRAM chips used in the memory or the spare pool. Those of skill in the art will also realize that the spare pool could consist of 2×1 Meg or 4×1 Meg DRAMs or other DRAM configurations if so desired.

Those of skill in the art will also realize that having more spare memory units will provide a greater measure of fault tolerance although the marginal cost of such greater fault tolerance is likely to be higher than for a system with only 2 sparable memory units for the chips in the array 10. The exact number of spare memory units that should be employed in a memory is determined by statistical reliability analysis such as that described by M. R. Lebson and H. E. Harvey in "A General Purpose Memory Reliability Simulator". IBM Journal of Research and Development #28 p. 196-205, March 1984.

The memory system array 10 and the spare pool 12 are coupled to the memory interface register 14 via bidirectional buses 16 and 18 respectively. The memory interface register 14 comprises a plurality of bit registers equaling in number to the number of data bits, check bits and spare bits available in the pool. In the preferred embodiment, the bidirectional bus 16 carries 137 bits and the bus 18 carries at least two bits with the exact number being determined by the number of spare memory units in the spare pool 12 which provide coverage for all rows of elements in the memory.

The spare merging network 20 couples to the memory interface register 14 and is operative, in response to control signals received from the sparing location registers 26 to insert the data from spare units in the spare pool 12 into the proper bit position of the data received from the array 10 in the event that a spare has been assigned to replace a portion of an element in the array 10 which was previously determined to have failed. When data is being written to memory, the spare merging network 20 operates to place data in a bit position which has been determined to be failing into the assigned spare unit at the same location. On a subsequent read operation, the spare chip is read and the bit is placed, as indicated above, into the proper bit position in data read from the spare merging network 20 to the bus 21. The data on the bus 21 comprises memory output data.

When data is read from the memory array 10 and the spare pool 12, 137 bits which comprise the 128 data bits and the 9 checking bits are presented to the ECC facility 22 by the spare merging network 20 over bus 21. The ECC facility 22 determines if there has been a read error. If no read error has occurred, the data read from the memory is transmitted to the processor 24. If an error is detected by the ECC facility 22 and the error is correctable, the corrected data is transmitted to the processor 24. The ECC facility 22 also transmits syndrome information, address information and control information over lines 27 to the maintenance facility 28. The syndrome information identifies the location and type of the failure while the address information identifies which chip in array 10 has failed. The syndrome information is utilized by the maintenance facility 28 to count the number of errors occurring in each identifiable portion of each memory element in the memory array 10. When the number of errors counted for a given identifiable portion of a memory element exceeds a predefined number, the maintenance facility 28 will cause a spare unit to be assigned to replace the portion of the memory element determined to be failing. When this occurs, the maintenance facility 28 causes the sparing location registers 28 to be updated so that a spare unit is assigned in place of the portion of the memory array element which has been determined to have failed. It is also possible that a previously assigned spare unit has failed and the maintenance facility 28 will cause another spare unit to be assigned to replace the failing previously assigned spare. In either case, the sparing location registers 26 are set to identify which spare units from the pool 12 are assigned to replace which elements in the array 10. The information in the sparing location registers 26 are presented to the spare merging network 20 so as to assure that the data is read correctly into or out of the elements in the memory array 10 and spare memory units pool 12.

Referring now to FIGS. 2A, 2B and 2C, each of the bit positions 1-137 plus spare locations $SP_1$ through $SP_n$, where n is the total number of spare units in the pool of spares, in the interface register 14 are coupled by lines to the spare merging network 20. The data and ECC bits 1-137 are coupled via lines $L_1$ through $L_{137}$ to logic within the spare merging network 20. As illustrated, line $L_1$ couples to a three input AND gate 100 whose output comprises an input to a multi-input OR gate 102. The output of OR gate 102 comprises bit position 1 of the spare merging network which is applied to the ECC facility 22.

A second input to the AND gate 100 is from line 104 which comprises a read enable line. The read enable line 104 has a one on it whenever the memory of the present invention is instructed to perform a read operation by the processor 24.

The remaining input to AND gate 100 is from an OR/Invert element 106. The OR/Invert element 106 is coupled via lines $LL_1$, $LM_1$ ... $LN_1$, where the number of such lines is equal to the number of possible spare units that can be assigned to replace a failing portion of a memory element, to registers 26. The signal on these lines are normally a binary zero and, accordingly, the normal output of the OR/Invert element 106 is a one. However, in the event that a spare unit has been assigned to replace a failing memory element (which in this case is chip 1) in the array 10, at least one of the lines $LL_1$, $LM_1$ ... $LN_1$ will have a binary 1 on it. This will cause the OR/Invert 106 to produce a binary 0 at its output thereby causing the output thereof to be a binary 0. This zero output comprises one input to OR gate 102. In this manner, the data read from the memory position 1 which is in the register 14 at bit position 1 is prevented from passing to the ECC facility 22. One of the remaining n three input AND gates 108 will be conditioned, however, to select the data from one of the spare locations $SP_x$, where x is a digit between 1 and n and n is the number of spare units available to be assigned as spares, and gate it into OR gate 102.

By way of example, reference is made to three input AND gate 110 which; is exemplary of the AND gates 108. This AND gate 110 has one input coupled to the read enable line 104. A second input is coupled to the line $LL_1$ which, if this line has a 1 on it, indicates that bit position 1 from the register 14 should be replaced by the data in spare position $SP_1$ which is coupled to the AND gate 110 over line $SL_1$.

Alternatively, if the spare location $SP_1$ is intended to replace bit position 2 instead of bit position 1 as described above, the line $LL_2$ will have a binary 1 on it and line $LL_1$ will have a binary 0 on it. This will cause AND gate 110 to be turned off and AND gate 112 to be conditioned to gate the data from spare location $SP_1$ to bit position 2.

The lines $LM_1$-$LM_{137}$ are used to identify which bit position is assigned, if it has been assigned at all, to be replaced by spare position data from spare location $SP_2$. There are a similar set of lines which are used to indicate which data bit position is intended to be replaced by each of the spare locations $SP_x$. These lines are coupled to AND gates in the spare merging network in a similar manner to those lines described above with respect to spare location $SP_1$.

Referring now to FIG. 2A, the sparing location registers 26 and associated logic are shown. There is a register, such as 120, for each of the spare bit positions in the memory interface 14. Each sparing location register such as 120 has 137 bit positions for identifying which bit position is to be replaced by the associated spare position in the interface 14. In addition, there are a plurality of bits in the spare location register which identify which row of memory elements in the array 10 is to have a spare unit substituted therefor. For sparing location register 120, the row identifier bit positions are illustrated at 122.

The row identifier bits 122 from register 120 are coupled over line 124 to a compare circuit 126. The compare circuit 126 is coupled via line 128 to the row address portion of the memory address being read. Whenever the row of the memory address is the same as in the bit positions 122 of sparing location register 120, the compare circuit 126 will produce an enable signal on line 130 which will enable the plurality of AND gates illustrated schematically at 132. Indeed, there are 137 two input AND gates which comprise the gates at 132. Each such gate has one input tied to the line 130 so as to enable such AND gates. The second input comes from a unique bit position in the register 120 which causes one of the lines $LL_1$–$LL_{137}$ to be activated, so as to identify the bit position that is to be replaced by a spare location.

FIG. 2A has additional spare location registers and associated compare circuits and AND gates to produce, for each spare location that can be assigned, a signal which will identify which row of memory elements is to have the associated spares and which bit position of the data read from the memory in that row should be replaced by the data in an assigned spare unit.

The above description of FIGS. 2A, 2B and 2C describes the read merging logic portion of the spare merging network 20. FIG. 2C also illustrates how the store merging logic interconnects with the remainder of the store merging network 20. Where the read merging logic portion of the spare merging network 20 places 137 data bits onto a bus which couples to the ECC facility, the store merging logic receives data from this bus, illustrated generally at 150, and places it onto 137 lines such as 152 which couple directly to the store merging elements 154. The output of the store merging elements are placed on a bus 156 which couples to the interface register 14. The store merging circuits 152 are controlled by the control signals appearing on the lines labelled $K_1$, $K_2$ through $K_N$ which come from the sparing location registers 26. Accordingly, data to be stored as received from the ECC facility 22 is manipulated by the store merging elements 154 so that the data being stored is directed to the memory 10 and any previously assigned spare unit in the spare pool 12.

FIG. 3 illustrates a typical store merging element which is quite similar in function and design to the read merging logic described in connection with FIGS. 2A, 2B and 2C. The circuitry for FIG. 3 is particularly for sparing, if a spare has been assigned, the bit from bit position 137 of the bus between the memory sparing network 20 and the ECC facility 22. In normal operation, however, a spare is not assigned. In that case, when the store signal on line 170 is activated by the processor 24 to indicate that a store operation has been selected, the store signal on line 170 comprises one input to each of the three input AND gates 172-178. AND gate 172 is the AND gate which normally will function on storing a word to the memory. For that gate, the data appearing on bit position 137 from the bus 21 between the ECC facility and the spare merging network comprises a second input thereto. The third input comes from the output of the OR/Invert circuit 180. This OR/Invert circuit 180 has as many inputs as there are spare bits which, for FIG. 3, is illustrated as N, where N is an integer greater than 3 as more than 3 spare location registers are illustrated in the circuitry of FIG. 2A. The first input of the OR/Invert circuit 180 is coupled to bit position 137 of the bus $K_1$ from the spare location register 120. The remaining lines on the K bus illustrated in FIG. 3 come from bit position 137 of the remaining spare location registers 2—N. If spare 1 is not assigned to correct bit position 137 of the currently addressed memory element, then the line $K_1(137)$ will be a zero. In a similar fashion, if no other spare has been assigned to correct bit position 137, all the remaining inputs to the OR/Invert circuit 180 will also be a zero. Accordingly, all the inputs will be a zero and the output of OR/Invert circuit 180 on line 182 will be a 1. As such, the inputs to AND gate 172 will be a one on the store line 170 and on line 182 which will cause the output on line 184 to be the same as the data on bit position 137 of bus 21. The data on line 184 is coupled to bit position 137 of the interface 14 so that it will be correctly stored in the elements of the memory array 10.

Now assume, however, that bit position 137 of the currently addressed row of memory elements had previously failed and that spare unit 1 had been assigned to replace it. In this case, the line $K_1(137)$ would be a 1. Any input to the OR/Invert circuit 180 being a 1 will cause the output 182 thereof to be a zero. Accordingly, the data sent on line 184 will automatically be a zero regardless of the actual data on the line for bit position 137 of bus 21. AND gate 174, on the other hand will have a 1 on the store line 170 and on line 186. This will cause AND gate 174 to be conditioned to place the data on the line 137 from bus 21 onto line 188 which couples to spare position 1 of the interface 14. As such, the data on bit position 137 of bus 21 will be rerouted to be stored at the addressed location on the first spare memory unit.

As indicated earlier, however, all of the spares cannot receive data for storing on each storing operation as this might cause data to be stored into a spare memory unit location which is not proper. Accordingly, the circuitry of FIG. 7 is utilized to activate for storing, only the spare units which have been assigned to replace a portion of a memory element in the currently addressed memory location. For the circuitry of FIG. 7, the line 170 carries the signal which indicates that a store operation is to be done. This signal is applied to each of the AND gates 400, 420 and 430. The second input to each of those AND gates 400, 420 and 430 come from the lines 130, 201 and 202 respectively which identify whether the associated spare has been assigned to be used with respect to a given data bit for the currently addressed store memory address. Accordingly, line 440 will be activated whenever the first spare has been allocated to replace a bit in the currently addressed memory location. Line 450 will be active when the second spare has been allocated to replace a bit in the currently addressed memory location. Likewise, line 460 will be active when the last spare N is allocated to replace a bit in the currently addressed memory location. These lines 440, 450 and 460 collectively comprise the lines 41 in FIG. 1 which carry the store control signals from the spare merging network 20 to the pool of spares 12 so as to make sure that only the allocated spare units are activated during storing operations.

The remaining circuitry in FIG. 3 operates in a similar manner allowing bit position 137 to be stored in any one of available spare units in accordance with the assignments established by the data in the sparing location registers. It will also be clear from FIG. 3 that the same circuitry of FIG. 3 must be duplicated with respect to each of the remaining 136 bit positions so that data will be correctly stored into the memory array 10 and pool of spares 12.

The ECC facility 22 of FIG. 1 is a conventional design for an error checking and correcting network. It is preferred that the ECC facility 22 be a two error detect-/one error correct network which is well known in the art. For example, one such network is described in "Fault-Tolerant Design Techniques for Semiconductor Memory Applications", IBM Journal of Research and Development, Volume 28, Number 2, March 1984, pages 177–183, the contents of which is herein incorporated by reference. Those of skill in the art, however, will recognize that the ECC facility described in that article is merely representative of the state of the art and that numerous other prior art references could have been referenced as well to describe another ECC facility which might be used as a substitute for that described above.

For purposes of the present invention, however, the ECC facility must comprise a network which is capable of detecting when a word read from memory has two or fewer errors. It should also locate and correct single errors occurring in data read from the memory. When such a read error is detected by the ECC facility 22, syndrome bits are generated in a manner well known in the prior art as illustrated for single error correct-double error detect (SEC-DED) codes in the article "Error-Correcting Codes for Semiconductor Memory Applications: A State-of-the-Art Review", IBM Journal of Research and Development, Vol. 28, No. 2, March 1984, pages 124–134, the content of which is hereby incorporated herein by reference. Those of skill in the art will recognize, however, that numerous other error detection and correction codes could be utilized in the present invention. In doing so, however, there are certain trade-offs which must be made. For example, if a greater number of errors are to be detected and corrected, more check bits are needed. In addition, the circuitry for performing the checking and correcting becomes more complex than for SEC-DED codes.

In any implementation of the ECC facility 22 of the type well known in the prior art, a syndrome will be developed whenever an error on reading data from memory is detected. This syndrome information is transferred over lines 27 (FIG. 1) to the maintenance facility 28 and is utilized thereby to modify the content of the sparing location registers 26 whenever the conditions have been met for the assignment of a spare for a failing memory element or portion thereof.

Referring now to FIG. 4, a flow chart of the operation of the system illustrated in FIG. 1 is presented. When the processor 24 initiates a memory fetch, an address is presented on bus 11 which serves to select the memory elements which are to be read. The data read from the memory array 10 and the spare pool 12 is then placed onto the interface 14. It passes through the spare merging network 20 into the ECC facility 22 as indicated at 200 in FIG. 4. The ECC facility 22 then determines if there are any read errors in the read data as indicated at 202. If there are no errors detected in the read data, the system continues and the processor 24 receives the data from the ECC facility over bus 23. The data on the bus 23 comprises corrected memory output data during memory read operations. This data is corrected as required by the ECC facility 22 and where no error is detected, this data is the same as the memory output data on the bus 21.

In the event that the ECC facility 22 determines there is a data error in the data received from the memory array 10 and the spare pool 12, the ECC facility 22 produces syndrome information which can be used to identify the error or errors in the well known manner as described in the above referenced IBM Journal of Research and Development articles. Basically, the syndrome information is passed by the ECC facility 22 over lines 27 to the maintenance facility 28. The maintenance facility 28, as indicated at 204 in FIG. 4 determines from this syndrome information if the detected error is a single or multi-bit error.

When a single bit error is detected at 204, the maintenance facility 22 determines which portion of a memory element is in error from the syndrome information and updates a memory element error counter as indicated at 206. Then, the maintenance facility 22 determines if the updated error counter has exceeded a predefined threshold or error count. When the threshold has not been exceeded, the maintenance facility does nothing and the system continues. The data in this case will have been corrected by the ECC facility 22 as that facility can correct single bit errors which have been detected.

The threshold is selected to be an arbitrary number which is related to how secure one desires the system to be. The smaller the threshold, the fewer correctable errors will occur before a given memory element or portion thereof is designated to be replaced by a spare. On the other hand, the higher the threshold the more likely it becomes that the memory element or portion thereof which is designated to be replaced by a spare is in fact failing.

When the maintenance facility 28 determines, as indicated at 208 in FIG. 4, that a memory element or portion thereof should be replaced by a spare because the error counter associated therewith has exceeded the threshold, the maintenance facility 28 first determines if a spare memory unit is available as shown at 210. If a spare is available, the spare assignment procedure is invoked as illustrated at 212. This spare assignment procedure will be described below in connection with FIG. 5.

In the event that there is not an available spare as indicated at 210, the maintenance facility 28 institutes a call for memory maintenance as indicated at 216. The details of this aspect of the system are not herein provided as they are not part of the present invention, however, such procedures are well known in the prior art with respect to memory systems utilized in large data processing systems. Indeed, all of the functions within dotted line A are beyond the scope of the present invention but will be described briefly so that a general idea as to what the system should do in the event of certain error conditions occur.

If the maintenance facility detects at 204 that a multi-bit error has occurred, an error recovery procedure is started as illustrated at 208. This error recovery procedure can take the form of such recovery as provided in, for example, IBM 3090 computers. If the error recovery is successful at 208, the success is detected at 220 and control returned to the maintenance facility 28 and the error counter 206 is updated. If the error recovery has not been successful, as indicated at 220, the system will cause the defective area of memory to be deallocated as illustrated at 222. Thereafter, a call for memory maintenance is initiated at 216.

The "No" outputs of the decision blocks of 204 and 210 could be replaced by a single line to the block 216.

In this alternative configuration, whenever an uncorrectable error is detected, memory maintenance will be requested without any attempt being made to invoke an error recovery procedure. This would simplify the system somewhat but may give rise to more service calls that would be necessary if an error recovery procedure were available.

Referring now to FIG. 5, the flow chart there illustrated indicates the function of the maintenance facility 28 of FIG. 1 while spare assignment, as indicated in block 212 of FIG. 4, occurs. The maintenance facility tests at 240 to determine if the memory is busy. If it is, as indicated at 242, the maintenance facility retests until the memory is not busy and then proceeds to the step at 246. If the memory is not busy when spare assignment is called for, control passes directly to step 246.

Once spare assignment can begin because the memory has been determined to be inactive, the maintenance facility then determines at 246 whether a previously assigned spare is being replaced by a spare because the previously assigned spare has failed. If this is the case, control passes to step 248 which causes the previously assigned spare to be deactivated. This is accomplished by raising the enable line to the sparing register associated with the failing spare unit and loading that register with all zeros. Once this is accomplished, control passes to step 250.

In the event that step 246 determines that the spare assignment required is not for replacing a previously assigned spare, control passes directly to step 250. In step 250, the next available spare unit is assigned to replace a failing memory element or failing portion thereof. This is done by raising the enable line to the spare location register associated with the memory unit being assigned and sending the memory unit row and bit position information thereto.

Control then passes to step 252 where the error counter for the failing chip is reset. Then, a mask is set to mask errors for the failing memory element for a period of time. This is required because subsequent read operations to memory locations including the newly assigned spare memory unit will cause a certain number of errors because the spare will not yet have the correct information in it. As error correcting will occur due to the ECC facility, this will not cause any data integrity problems so long as there are not any multiple bit errors detected. Over a period of time, however, the data stored into the memory will fill up the newly assigned spare memory unit and no further read errors will occur. At that time, the masking of errors can be removed. The exact time that error masking must take place is machine and application dependent. Accordingly, analysis of thee system is required to determine the length of error masking which is required to maintain system data integrity. That time will clearly vary form system to system and application to application but will be determinable for each system and application. After the interval has passed, however, the maintenance facility will remove the error mask so that subsequent errors associated with the assigned spare can be counted.

FIG. 6 illustrates the hardware required for a maintenance facility to accomplish the functions described above. The bus 27 between the ECC facility 22 and the maintenance facility 28 contains lines for carrying control information and address and syndrome information to and from the interface adapter logic 300. This logic 300 couples to the address, data and control buses 302, 304, and 306 respectively. The buses 302, 304 and 306 couple to a RAM 308, a ROM 310 and a microprocessor 312 which comprises a simple control processor configuration well known to those of skill in the art. The ROM 310 has a control program recorded therein for performing the functions set forth above for the maintenance facility. The data required by the functions are stored in the RAM 308.

The interface logic 300 also includes a plurality of control lines 314, one to each of the sparing location registers, to activate the connected sparing location register to receive the data placed on the bus 316 which carries the row information identifying the memory element to be spared and the position of the memory element in that row that is to be spared. The data on bus 316 is determined by the maintenance facility from the information stored in RAM 308 which indicates that the error count for a given memory element has exceeded a prescribed limit and that a spare should be assigned therefor. Information is stored in RAM 308 to indicate which spare memory elements have been previously assigned so that if a spare memory unit fails, this condition can be detected as well. As indicated above, if a previously assigned spare does fail, the sparing location register associated therewith is cleared and a new spare is assigned to replace the failing memory element.

While the preceding description has concentrated on the preferred embodiment of the present invention, those skilled in this art will recognize the the above mentioned and other modifications to the preferred implementation of the invention can be made without departing from the spirit and scope of the invention as defined by the following claims.

What is claimed is:

1. A fault tolerant memory system comprising, in combination:

an array of memory chips arranged in at least two dimensions and having addressable locations, each addressable memory location containing a plurality of data bits and a plurality of check bits for checking the integrity of all the data bits and check bits at a given addressable location;

a pool of spare chips including at least two spare chips which may be assigned to replace any of said memory chips or a previously assigned spare chip; and means for detecting, in response to said data bits and said check bits read from a given memory location, a failing memory chip or previously assigned spare chip and for assigning a previously unassigned spare chip to replace the failing memory chip or previously assigned spare chip.

2. The fault tolerant memory of claim 1 wherein the number of check bits is determined by the smallest digit r which satisfies the equation $k+r \leq 2^{(r-1)}$ where k is the number of data bits and r is the number of check bits.

3. The fault tolerant memory of claim 1 additionally including error correction means responsive to said data bits and said check bits to correct the data read from the memory when a correctable error is detected.

4. The fault tolerant memory of claim 1 additionally including means for reading a spare memory chip when it has been assigned to replace an addressed memory chip previously determined to have failed and to merge the data read from said assigned spare memory chip into the desired bit position of the data read from the memory.

* * * * *